United States Patent
Ishikawa et al.

(10) Patent No.: US 12,269,248 B2
(45) Date of Patent: Apr. 8, 2025

(54) FILM PEELING APPARATUS AND FILM PEELING METHOD

(71) Applicant: Honda Motor Co., Ltd., Tokyo (JP)

(72) Inventors: Taiki Ishikawa, Raymond, OH (US); Hiroyuki Yamagishi, Tokyo (JP); Tomohide Shibutani, Raymond, OH (US); Shinsaku Takikawa, Tokyo (JP)

(73) Assignee: Honda Motor Co., Ltd., Tokyo (JP)

( * ) Notice: Subject to any disclaimer, the term of this patent is extended or adjusted under 35 U.S.C. 154(b) by 119 days.

(21) Appl. No.: 18/127,557

(22) Filed: Mar. 28, 2023

(65) Prior Publication Data
US 2024/0326400 A1    Oct. 3, 2024

(51) Int. Cl.
*B32B 43/00*    (2006.01)
(52) U.S. Cl.
CPC ....... *B32B 43/006* (2013.01); *Y10T 156/1132* (2015.01); *Y10T 156/1944* (2015.01)
(58) Field of Classification Search
CPC ............ B32B 43/006; Y10T 156/1132; Y10T 156/1944
See application file for complete search history.

(56) References Cited

U.S. PATENT DOCUMENTS

| | | | | |
|---|---|---|---|---|
| 9,731,492 | B2* | 8/2017 | Lee | B32B 43/006 |
| 9,805,953 | B2* | 10/2017 | Ohno | H01L 21/6838 |
| 11,260,646 | B2* | 3/2022 | Bennett | B32B 43/006 |
| 2014/0209250 | A1* | 7/2014 | Kawagoe | B32B 43/006 |
| | | | | 156/701 |
| 2015/0343755 | A1* | 12/2015 | Honda | B32B 43/006 |
| | | | | 156/714 |
| 2020/0238678 | A1* | 7/2020 | Makino | H05K 3/0044 |

FOREIGN PATENT DOCUMENTS

JP    2020109046 A    7/2020

\* cited by examiner

*Primary Examiner* — Philip C Tucker
*Assistant Examiner* — Nickolas R Harm
(74) *Attorney, Agent, or Firm* — Duft & Bornsen, PC

(57) ABSTRACT

A film peeling apparatus includes: a moving member; a first rod having a first contact portion at a lower end that contacts an upper surface of a film; a second rod having a second contact portion at a lower end; and a support portion supporting the first and second rods such that the first and the second rods move in a vertical direction with a movement of the moving member in the vertical direction. The first contact portion has a suction portion that sucks the film, the second contact portion has a sliding portion so that the film can be moved in a horizontal direction while the film is pressed by the second rod. When the moving member moves, the support portion support the first rod and the second rod so that the second rod starts to rise after the first rod starts to rise.

16 Claims, 8 Drawing Sheets

FILM PEELING APPARATUS AND FILM PEELING METHOD

BACKGROUND OF THE INVENTION

Field of the Invention

The present invention relates to a film peeling apparatus and a film peeling method which peel a film from a workpiece to which the film is tightly adhered.

Description of the Related Art

As a conventional device of this type, a device that peels off a protective sheet from a prepreg sheet to which the protective sheet is attached is known. Such a device is disclosed, for example, in JP 2020-109046 A. In the device described in JP 2020-109046 A, air is injected to the end surface of the prepreg sheet to peel off the protective sheet from the prepreg sheet.

However, it is difficult to peel off the film adhered to the workpiece with a configuration that injects air, as in the device described in JP 2020-109046 A.

SUMMARY OF THE INVENTION

An aspect of the present invention is a film peeling apparatus peeling a film from a workpiece to which the film is tightly adhered. The film peeling apparatus includes: a moving member disposed above a placement member on which the workpiece is placed so as to be vertically movable between a first position and a second position above the first position; a first rod extending downward from the moving member toward the placement member and having a first contact portion at a lower end portion of the first rod that contacts an upper surface of the film when the moving member is located at the first position; a second rod extending downward from the moving member toward the placement member and having a second contact portion at a lower end portion of the second rod that contacts the upper surface of the film when the moving member is located at the first position; and a support portion configured to support the first rod and the second rod from the moving member such that the first rod and the second rod move in a vertical direction with a movement of the moving member in the vertical direction. The first contact portion has a suction portion that sucks the film, the second contact portion has a sliding portion so that the film can be moved in a horizontal direction while the film is pressed by the second rod, and when the moving member moves from the first position to the second position, the support portion supports the first rod and the second rod so that the second rod starts to rise after the first rod starts to rise.

BRIEF DESCRIPTION OF THE DRAWINGS

The objects, features, and advantages of the present invention will become clearer from the following description of embodiments in relation to the attached drawings, in which.

DETAILED DESCRIPTION OF THE INVENTION

Hereinafter, an embodiment of the present invention will be described with reference to FIGS. 1 to 7. A film peeling apparatus according to an embodiment of the present invention peels and removes a protective film from a surface of a workpiece to which the protective film has been attached in advance. The workpiece is, for example, a resin frame to be incorporated into a fuel cell stack that is a component of a fuel cell.

This frame supports an assembly of an electrolyte membrane and anode and cathode electrodes disposed on both sides of the electrolyte membrane, that is, a membrane electrode assembly (MEA), and is also called a sub-gasket. By alternately stacking a frame integrated with the assembly and a metal separator in a predetermined number of layers, a fuel cell stack containing a plurality of power generation cells is configured.

Figure 1:
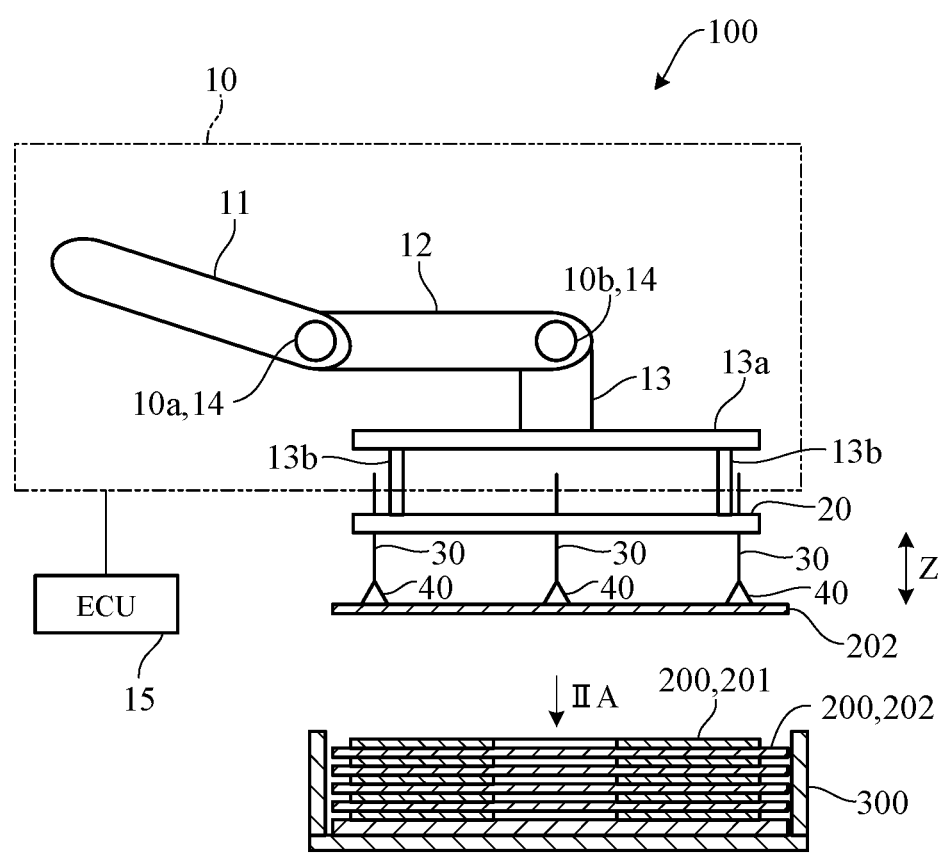
FIG. 1 is a diagram schematically illustrating an overall configuration of a film peeling apparatus according to an embodiment of the present invention.

FIG. 1 schematically illustrates an overall configuration of a film peeling apparatus 100 according to an embodiment of the present invention. As illustrated in FIG. 1, the film peeling apparatus 100 includes an industrial robot 10 having articulated arms 11 and 12 and a hand 13 provided at the end of the arm 12, a support plate 20 attached to the hand 13, and a plurality of rods 30 supported by the support plate 20.

The arms 11 and 12 are rotatably connected via a rotary shaft 10a, and the arm 12 and the hand 13 are rotatably connected via a rotary shaft 10b. Note that the configuration of the robot 10 (the number of arms and the like) is not limited to that illustrated in the figure. The arms 11 and 12 and the hand 13 are rotated by the drive of an actuator 14 such as a servo motor provided on the rotary shafts 10a and 10b, for example, which changes the position and posture of the hand 13. The actuator 14 is controlled by an ECU 15. The ECU 15 is an electronic control unit including a computer having CPU, ROM, RAM and other peripheral circuits.

The support plate 20 is fixed to the plate 13a at the end of the hand 13 via a spacer 13b. Therefore, the support plate 20 is provided in substantially parallel with the plate 13a, separated from the plate 13a by a predetermined distance, and moves together with the hand 13. Therefore, the position and posture of the support plate 20 can be controlled by the ECU 15. Specifically, the support plate 20 can be moved in the direction of an arrow Z, that is, raised or lowered in the vertical direction, while the support plate 20 is held in the horizontal posture illustrated in FIG. 1.

The rods 30 extend in a direction substantially perpendicular to the support plate 20, in other words, in a vertical direction with respect to the support plate 20 in a horizontal posture. A pad 40 is provided at the lower end portion of each of the rods 30. The pad 40 includes a suction pad that sucks an object 200, such as a workpiece 201 and a protective film 202. The rods 30 of the suction pads are configured in a cylindrical shape and their internal passages are connected to a vacuum generator, and a negative pressure (vacuum pressure) is generated in the suction pads via the vacuum generator, so that the object 200 can be sucked. FIG. 1 illustrates the support plate 20 in a horizontal posture on which the protective film 202 is sucked.

The support plate 20 is raised and lowered above a tray 300 whose upper surface is opened. The tray 300 stores the workpieces 201 in a stacked state, and the tray 300 constitutes a platform for the workpieces 201. The protective films 202 are attached between the workpieces 201, and the workpieces 201 and the protective films 202 are alternately stacked. The protective films 202 are flexible, bendable, thin resin films such as polyethylene naphthalate. In the tray 300, the protective films 202 are tightly adhered to the surfaces of the workpieces 201.

Figure 2A:
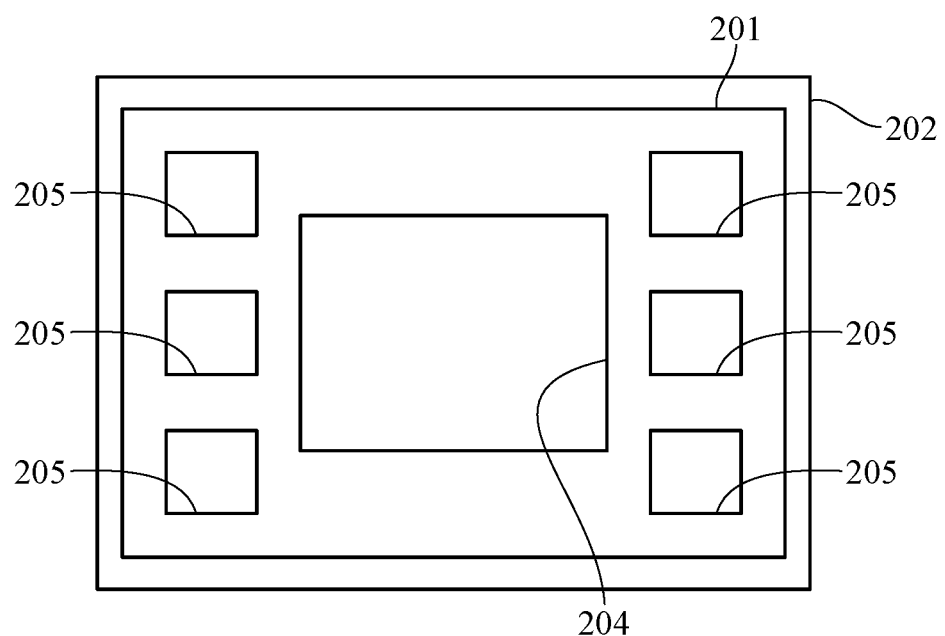
FIG. 2A is an arrow view IIA in FIG. 1.
Figure 2B:
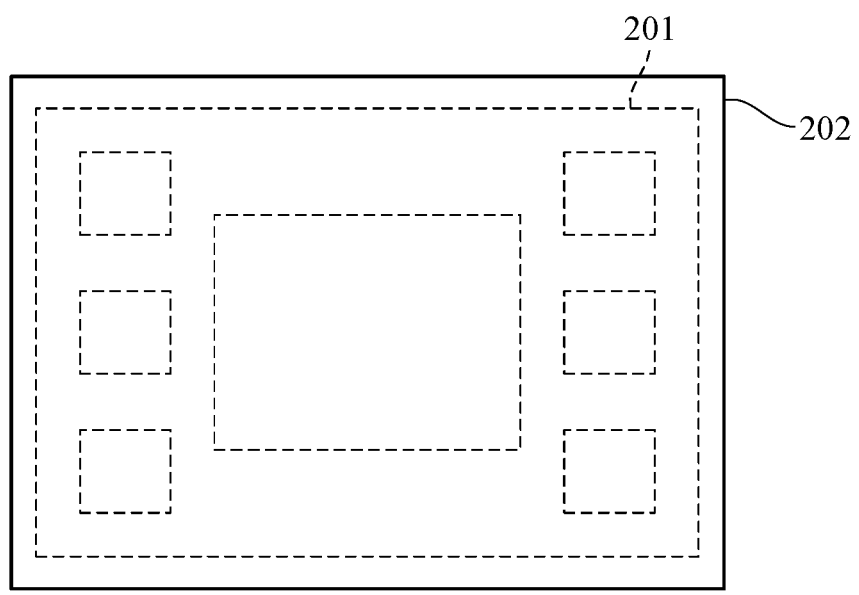
FIG. 2B is a diagram shown FIG. 2A from the opposite side.

FIG. 2A is a plan view (arrow view IIA in FIG. 1) illustrating the inside of the tray after a protective film 202 is separated from the surface of a workpiece 201. As illustrated in FIG. 2A, the workpiece 201 is disposed at the uppermost portion of the tray 300. As described above, the workpiece 201 is a substantially rectangular resin frame that supports the membrane electrode assembly of the fuel cell. A substantially rectangular opening 204 is provided in the center of the workpiece 201. After the workpiece 201 is taken out from the tray 300, a membrane electrode assembly is formed so as to cover the opening 204. The workpiece 201 is also provided with a plurality of through holes 205 that constitute flow paths for supplying and discharging fuel gas, oxidant gas, and cooling medium.

As described above, the workpiece 201 had the opening 204 and the through holes 205. Therefore, when the workpiece 201 is located at the uppermost portion of the tray 300 (FIG. 2A), the protective film 202 below the workpiece 201 can be pressed from above by holding pads (not illustrated) via the opening 204 and the through holes 205. Then, vacuum breakdown can be caused at the interface between the workpiece 201 and the protective film 202 by sucking the workpiece 201 with the suction pads while pressing down on the protective film 202 with the holding pads, which allows the workpiece 201 and the protective film 202 to be separated. When the workpiece 201 is disposed in the tray 300, the workpiece 201 may not have the through holes 205.

On the other hand, when the protective film 202 is located at the uppermost portion of the tray 300 (FIG. 2B), since the protective film 202 has no through holes, the workpiece 201 below the protective film 202 cannot be pressed by the holding pads from above. This makes it difficult to peel the tightly adhered protective film 202 from the workpiece 201, and if the protective film 202 is raised via the suction pads, the workpiece 201 may also be raised with it. Therefore, in order to enable easy peeling of the protective film 202 even in the case illustrated in FIG. 2B, the present embodiment configures the film peeling apparatus 100 as follows.

The film peeling apparatus 100 according to the present embodiment includes three types of rods and pads that operate differently from each other. Hereinafter, the three types of rods are referred to as the suction rod, first holding rod, and second holding rod for convenience, and the pads at the ends of the suction rod, first holding rod, and second holding rod are referred to as the suction pad, first holding pad, and second holding pad, respectively.

Figure 3:
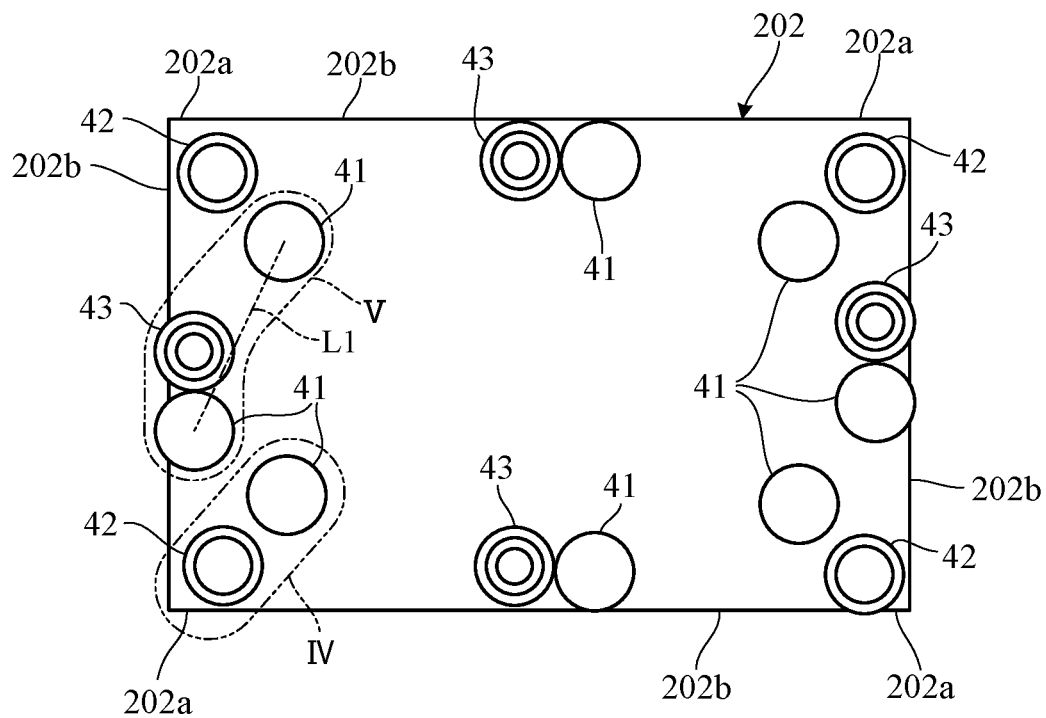
FIG. 3 is a diagram illustrating positions of the pads included in the film peeling apparatus in FIG. 1.

FIG. 3 illustrates the positions of the pads 40 (suction pads 41, first holding pads 42, and second holding pads 43) that are in contact with the upper surface of the protective film 202. In the figure, the suction pads 41 are indicated by circles, the first holding pads 42 by double circles, and the second holding pads 43 by triple circles.

First, the relationship between a suction rod 31 and a first holding rod 32 will be described. As illustrated in FIG. 3, the protective film 202 has four corner portions 202a and four sides (edge portions 202b). A first holding pad 42 is disposed inside each of the four corner portions 202a. More specifically, the first holding pads 42 are disposed on the diagonal line (not illustrated) connecting the corner portions 202a and 202a and in proximity to the edge portion 202b of the protective film 202. Inside each of the first holding pads 42 (the opposite side of the corner portion 202a), a suction pad 41 is disposed adjacent to the first holding pad 42.

Figure 4A:
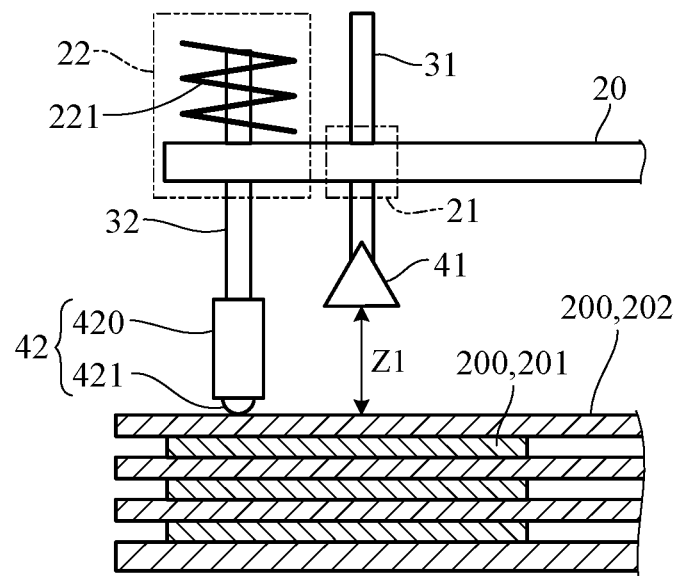
FIG. 4A is a diagram illustrating a schematic configuration of the suction rod and the first holding rod included the film peeling apparatus in FIG. 1 and an example of operation of the suction rod and the first holding rod.

FIG. 4A is a schematic view of the configuration of the suction rod 31 and the first holding rod 32, that is, a side view of an area IV in FIG. 3. FIG. 4A is a view illustrating the middle of the lowering operation of the support plate 20, and illustrates the point in time at which the first holding pads 42 start to contact the protective film 202.

As illustrated in FIG. 4A, the suction rod 31 extends vertically through the support plate 20 and is supported by the support plate 20 via a support portion 21. The support portion 21 is a fixing portion that fixedly supports the suction rod 31 on the support plate 20, and fixes, for example, a flange portion extending in the horizontal direction from the outer peripheral surface of the suction rod 31 to the upper surface of the support plate 20 via a bolt. The support portion 21 may be configured by a joining means such as welding, and the suction rod 31 may be fixed to the support plate 20 via the joining means. The suction rod 31 is formed in a cylindrical shape and has an internal passage extending in the vertical direction. The internal passage connects to a vacuum generator (not illustrated).

The suction pad 41 is made of a member having elasticity such as rubber or resin. The suction pad 41 has a through hole from the upper end surface to the lower end surface, and the through hole connects to the vacuum generator via the internal passage of the suction rod 31. The lower end surface of the suction pad 41 is a suction surface that sucks the object 200 such as the workpiece 201 or protective film 202. When the vacuum generator is turned on to create a vacuum inside the through hole, a suction force acts on the object 200, and the object 200 can be sucked. When the vacuum generator is turned off, the suction force is removed and the object 200 can be released from the suction surface. Turning the vacuum generator on and off includes opening and closing a solenoid valve provided in the middle of a flow path connecting the vacuum generator and the internal passage of the suction rod 31. The turning on/off of the vacuum generator (for example, opening/closing of the solenoid valve) is controlled by the ECU 15 (FIG. 1).

The first holding rod 32 extends vertically through the support plate 20, and is supported by the support plate 20 via the support portion 22. The support portion 22 includes a spring 221, and supports the first holding rod 32 via the spring 221 so that it can move vertically relative to the support plate 20. The spring 221 is, for example, a tension coil spring disposed around the first holding rod 32 above the support plate 20. The upper end portion of the spring 221 is connected to the upper end portion of the first holding rod 32, and the lower end portion is connected to the upper surface of the support plate 20. FIG. 4A illustrates an initial state in which no biasing force acts on the spring 221, and the length of the spring 221 is a free length.

The first holding pad 42 has a sliding portion 421 such that the protective film 202 can move (slide) in the horizontal direction along the upper surface of the workpiece 201 while the protective film 202 is pressed by the first holding rod 32. The sliding portion 421 includes a ball or a roller that is rotatably supported by a case member 420 at the end of the first holding pad 42 via a rotating shaft extending in the horizontal direction. In the initial state in FIG. 4A, the lower end of the first holding pad 42 (sliding portion 421) is located below the lower end of the suction pad 41 by a predetermined length Z1.

With reference to FIGS. 4A to 4D, the operation of the film peeling apparatus 100 via the suction rod 31 and the first holding rod 32 will be described. The support plate 20 is lowered from the initial state illustrated in FIG. 4A. At this time, since the lower end of the first holding rod 32 is already in contact with the upper surface of the protective film 202, the suction rod 31 descends together with the support plate 20 while the position of the first holding rod 32 remains constant.

Figure 4B:
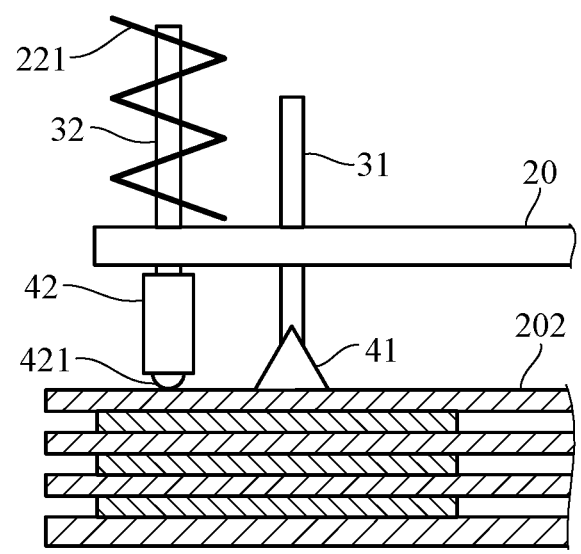
FIG. 4B is a diagram illustrating an example of subsequent operation after FIG. 4A.

When the support plate 20 is lowered by the predetermined length Z1 from the state in FIG. 4A, the suction pad 41 contacts the upper surface of the protective film 202 as illustrated in FIG. 4B. At this time, since the spring 221 is pulled by the predetermined length Z1, a downward pressing force acts on the first holding rod 32 via the spring 221. Therefore, the protective film 202 is pressed downward via the first holding pad 42. In this state, the vacuum generator is turned on to start suction of the protective film 202 via the suction pad 41.

Figure 4C:
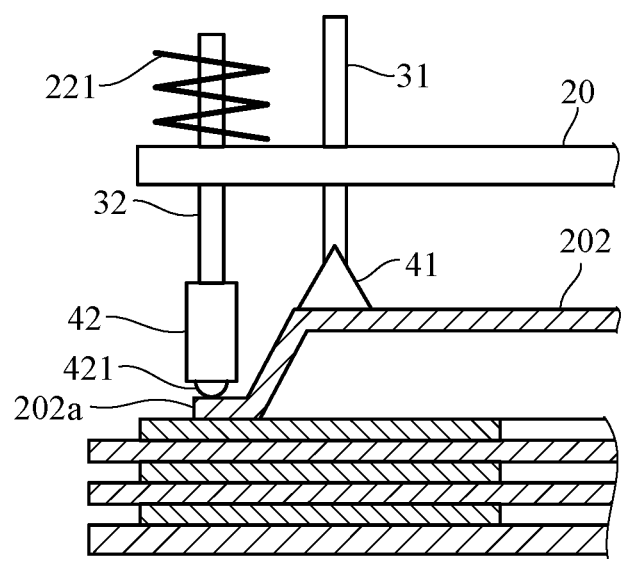
FIG. 4C is a diagram illustrating an example of subsequent operation after FIG. 4B.

When the support plate 20 is raised from the state in FIG. 4B, the suction pad 41 is raised. Until the support plate 20 is raised by the predetermined length Z1, the first holding pad 42 remains in contact with the protective film 202 due to the biasing force of the spring 221. As a result, as illustrated in FIG. 4C, a part of the protective film 202 (the opposite side of the corner portion 202a) is sucked and raised by the suction pad 41 while the end portion of the protective film 202 (corner portion 202a) is pressed by the first holding pad 42. The end portion of the protective film 202 is pressed by the first holding pad 42, which prevents the workpiece 201 from being sucked by the protective film 202 and raised together with the protective film 202.

At this time, since a tensile force acts on the protective film 202 from the suction pad 41, the protective film 202 moves in the horizontal direction (toward the suction pad side) while sliding along the upper surface of the workpiece 201 below the sliding portion 421. In this case, since the ball or roller of the sliding portion 421 rotates, which promotes the movement of the protective film 202 while the protective film 202 is pressed by the first holding pad 42. In a state where the support plate 20 is raised by the predetermined length Z1, the end portion (corner portion 202a) of the protective film 202 is located below the first holding pad 42.

Figure 4D:
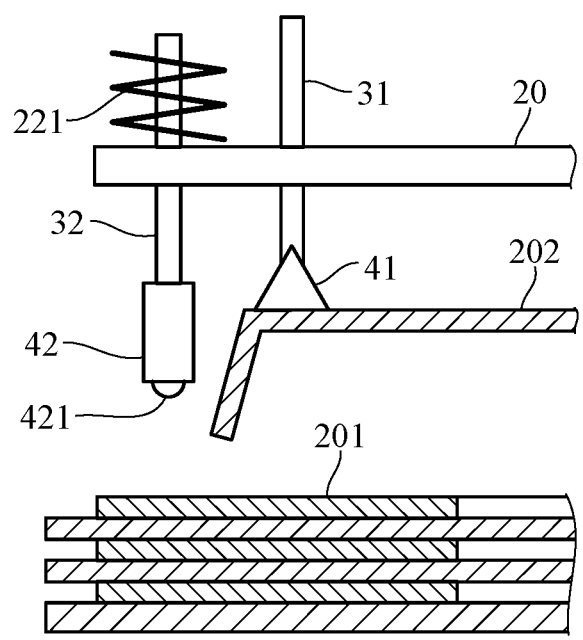
FIG. 4D is a diagram illustrating an example of subsequent operation after FIG. 4C.

When the support plate 20 is further raised from the state in FIG. 4C, as illustrated in FIG. 4D, the first holding rod 32 is raised together with the support plate 20, and the first holding pad 42 is separated from the protective film 202. As a result, the protective film 202 below the first holding pad 42 is peeled off from the upper surface of the workpiece 201.

Next, the relationship between the suction rod 31 and the second holding rod 33 will be described. As illustrated in FIG. 3, inside the middle of the four sides (edge portions 202b) of the protective film 202, the suction pads 41 and the second holding pads 43 are disposed side by side along the edge portions 202b. Therefore, as illustrated in the area V, a pair of suction pads 41 are disposed on both sides of a second holding pad 43, and the second holding pad 43 is located outside of a virtual line L1 connecting the pair of suction pads 41 (on the edge side of the protective film 202).

Figure 5A:
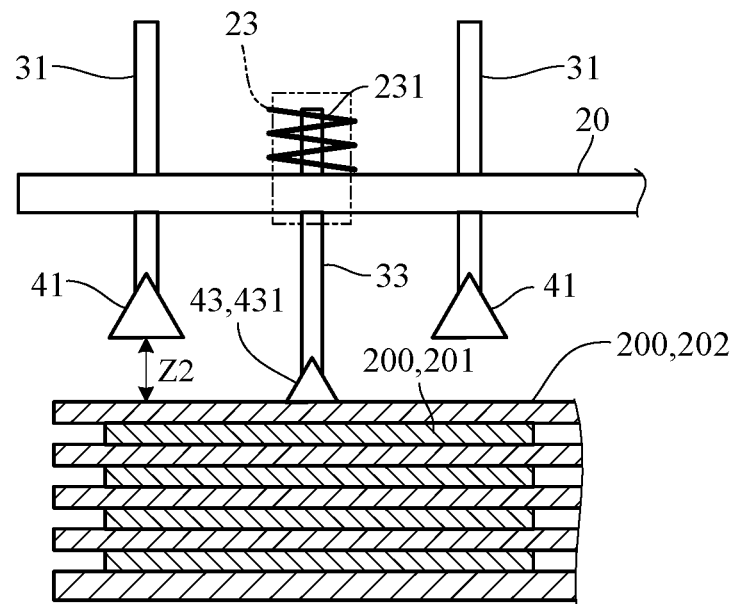
FIG. 5A is a diagram illustrating a schematic configuration of the suction rod and the second holding rod included the film peeling apparatus in FIG. 1 and an example of operation of the suction rod and the second holding rod.

FIG. 5A is a schematic view of the configuration of the suction rods 31 and the second holding rod 33, that is, a side view of the area V in FIG. 3. As in FIG. 4A, FIG. 5A is a view illustrating the middle of the lowering operation of the support plate 20, and illustrates the point in time at which the second holding pad 43 starts to contact the protective film 202. In FIG. 3, the second holding pad 43 is closer to one of the pair of suction pads 41, but FIG. 5A illustrates the second holding pad 43 as being located in the middle of the pair of suction pads 41 for convenience.

As illustrated in FIG. 5A, the second holding rod 33 extends vertically through the support plate 20 and is supported by the support plate 20 via a support portion 23. The support portion 23 includes a spring 231, and supports the second holding rod 33 via the spring 231 so that it can move vertically relative to the support plate 20. The spring 231 is, for example, a tension coil spring disposed around the second holding rod 33 above the support plate 20. The upper end portion of the spring 231 is connected to the upper end portion of the second holding rod 33, and the lower end portion is connected to the upper surface of the support plate 20. FIG. 5A illustrates an initial state in which no biasing force acts on the spring 231, and the length of the spring 231 is a free length.

The second holding pad 43 includes an elastic body 431 so that the protective film 202 can be displaced while the protective film 202 is pressed by the second holding rod 33. The elastic body 431 is made of rubber, resin, or the like. In the initial state in FIG. 5A, the lower end of the second holding pad 43 is located below the lower end of the suction pads 41 by a predetermined length Z2. The predetermined length Z2 is shorter than the predetermined length Z1 (FIG. 4A). Note that Z2 may be equal to Z1.

Figure 5B:
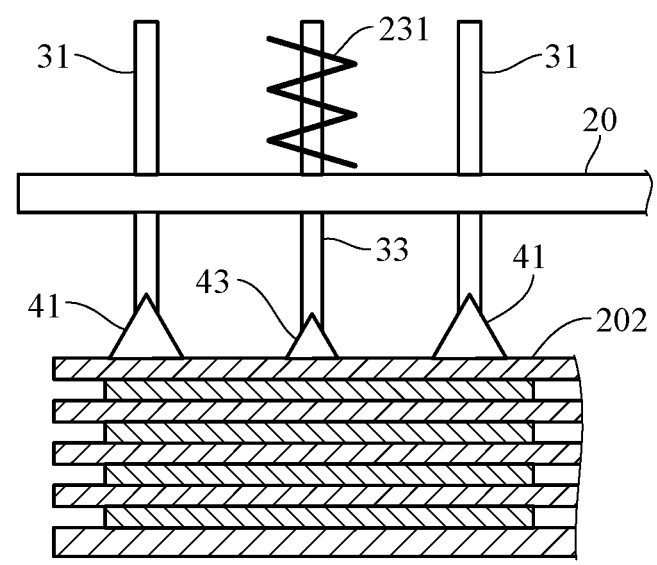
FIG. 5B is a diagram illustrating an example of subsequent operation after FIG. 5A.
Figure 5C:
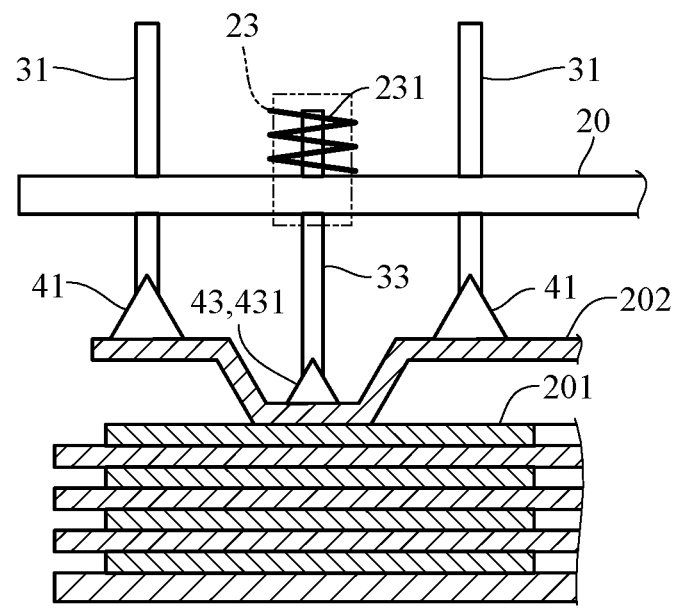
FIG. 5C is a diagram illustrating an example of subsequent operation after FIG. 5B.

With reference to FIGS. 5A to 5C, the operation of the film peeling apparatus 100 via the suction rods 31 and the second holding rod 33 will be described. The support plate 20 is lowered from the initial state illustrated in FIG. 5A. At this time, since the lower end of the second holding rod 33 is already in contact with the upper surface of the protective film 202, the suction rods 31 descend together with the support plate 20 while the position of the second holding rod 33 remains constant.

When the support plate 20 is lowered by a predetermined amount (predetermined length Z2) from the state in FIG. 5A, the suction pads 41 contact the upper surface of the protective film 202 as illustrated in FIG. 5B. At this time, since the spring 231 is pulled by the predetermined length Z2, a downward pressing force acts on the second holding rod 33 via the spring 231. Therefore, the protective film 202 is pressed downward via the second holding pad 43.

When the support plate 20 is raised from the state in FIG. 5B, the suction pads 41 are raised. Until the support plate 20 is raised by the predetermined length Z2, the second holding pad 43 remains in contact with the protective film 202 due to the biasing force of the spring 231. At this time, a tensile force acts on the protective film 202 while the elastic body 431 of the second holding pad 43 is elastically deformed, which causes vacuum breakdown at the interface between the workpiece 201 and the protective film 202, allowing air to infiltrate the interface.

Figure 6:
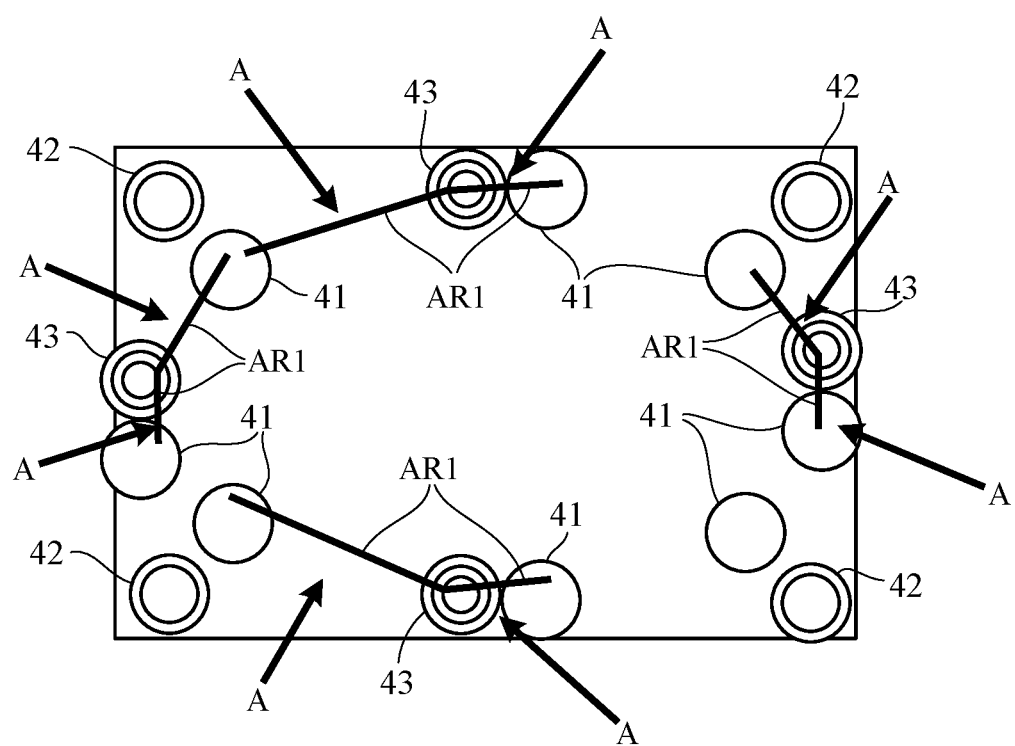
FIG. 6 is a diagram illustrating the operation corresponding to FIG. 5C on a protective film.

In this case, as indicated by an arrow A in FIG. 6, air infiltrates areas AR1 connecting the second holding pads 43 and the suction pads 41 from the outside, which causes wrinkles in the areas AR1. As a result, peeling of the protective film 202 is promoted, and the protective film 202 can be easily peeled off from the workpiece 201 when the protective film 202 is pulled upward by the suction pads 41.

The operation of the film peeling apparatus 100 according to the present embodiment is summarized as follows. The following operation represents the step of peeling the protective film 202 by the film peeling method according to the present embodiment. First, the robot 10 is driven by a command from the ECU 15, and the support plate 20 is moved to the initial position above the tray 300 in a horizontal posture (initial moving step). Next, the support plate 20 is lowered by the drive of the robot 10 until the suction pads 41, the first holding pads 42, and the second holding pads 43 contact the upper surface of the protective film 202 (lowering step). At this time, first the first holding pads 42, then the second holding pads 43, and finally the suction pads 41 contact the protective film 202.

The position of the support plate 20 in a state where all the pads 41 to 43 are in contact with the protective film 202 (FIGS. 4B and 5B) may be referred to as a first position. The initial position of the support plate 20 before it is lowered may be referred to as a second position. The support plate 20 is provided to be movable between the first and second positions.

Figure 7:
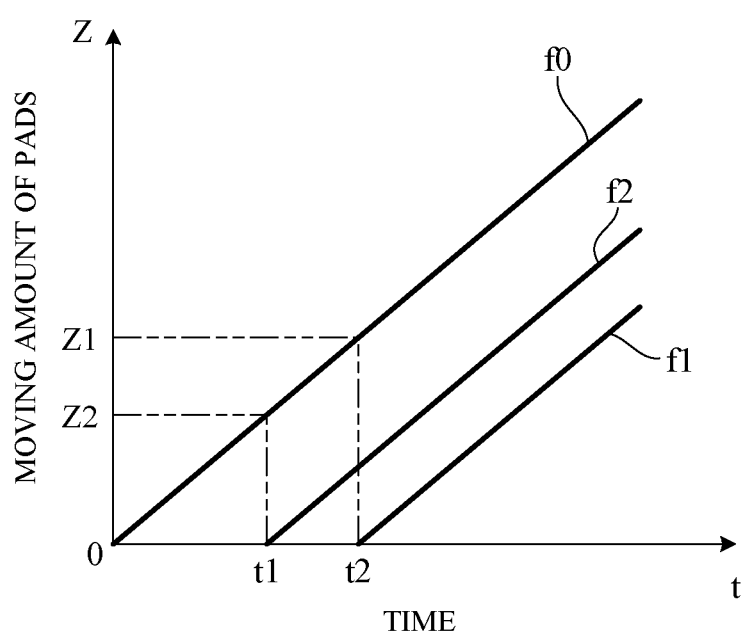
FIG. 7 is a diagram illustrating moving amount of the pads over time of raising step by a film peeling method according to the embodiment of the present invention.

Next, the vacuum generator is turned on by a command from the ECU 15 to start suction of the protective film 202 by the suction pad. Further, the support plate 20 is raised at a predetermined speed by the drive of the robot 10 (raising step). FIG. 7 illustrates the moving amount of the pads 40 over time from the start point in time of the raising step. In the figure, the characteristic f0 corresponds to the moving amount of the suction pads 41, the characteristic f1 corresponds to the moving amount of the first holding pads 42, and the characteristic f2 corresponds to the moving amount of the second holding pads 43.

As illustrated in FIG. 7, until the point t1, only the suction pads 41 rise while the first holding pads 42 and the second holding pads 43 press the protective film 202 by the biasing force of the springs 221 and 231. By delaying the start point in time of the rise of the first holding pads 42 from the start point in time of the rise of the suction pads 41, the rise of the workpiece 201 is prevented by the first holding pads 42. On the other hand, since the protective film 202 is movable relative to the first holding pads 42 via the sliding portions 421, the protective film 202 can be raised.

At this time, since the protective film 202 rises while being pressed by the second holding pads 43, vacuum breakdown occurs in the areas AR1 between the suction pads 41 and the second holding pads 43, causing air to infiltrate the areas AR1 (FIG. 6). At the point t1, when the moving amount of the suction pads 41 reaches a predetermined value (predetermined length Z2), the second holding pads 43 start to rise (FIG. 5C). Thereafter, until the point t2, the suction pads 41 and the second holding pads 43 rise while the first holding pads 42 press the protective film 202 by the biasing force of the spring 221. At the point t2, when the moving amount of the suction pads 41 reaches a predetermined value (predetermined length Z1), the first holding pads 42 start to rise (FIG. 4C). As a result, the protective film 202 can be easily peeled off from the workpiece 201.

According to the present embodiment, the following operational effects can be achieved.

(1) A film peeling apparatus 100 peeling a protective film 202 from a workpiece 201 to which the protective film 202 is tightly adhered, and includes: a support plate 20 disposed above a tray 300 on which the workpiece 201 is placed so as to be vertically movable between a first position and a second position above the first position; a suction rod 31 extending downward from the support plate 20 toward the tray 300 and having a suction pad 41 at its lower end portion that contacts the upper surface of the protective film 202 when the support plate 20 is located at the first position; a first holding rod 32 extending downward from the support plate 20 toward the tray 300 and having a first holding pad 42 at its lower end portion that contacts the upper surface of the protective film 202 when the support plate 20 is located at the first position; and support portions 21 and 22 which supports the suction rod 31 and the first holding rod 32 from the support plate 20 such that the suction rod 31 and the first holding rod 32 move in the vertical direction with the movement of the support plate 20 in the vertical direction (FIGS. 1 and 4A). The suction pad 41 functions as a suction portion that sucks the protective film 202. The first holding pad 42 has a sliding portion 421 so that the protective film 202 can be moved in the horizontal direction while the protective film 202 is pressed by the first holding rod 32 (FIG. 4A). When the support plate 20 moves from the first position to the second position, the support portions 21 and 22 support the suction rod 31 and the first holding rod 32 so that the first holding rod 32 starts to rise after the suction rod 31 starts to rise (FIGS. 4A to 4D and 7). With this configuration, the start point in time of the rise of the first holding pad 42 is delayed from the start point in time of the rise of the suction pad 41, and thus the first holding pad 42 prevents the workpiece 201 from rising together with the protective film 202 when the protective film 202 is sucked by the suction pad 41. In addition, since the protective film 202 is movable relative to the first holding pad 42 via the sliding portion 421, the protective film 202 can be raised while sliding over the upper surface of the workpiece 201. As a result, the protective film 202 tightly adhered to the workpiece 201 can be easily peeled off.

(2) The sliding portion 421 has a rotatable ball or roller (FIG. 4A). As a result, the protective film 202 can be easily moved in the horizontal direction with respect to the first holding pad 42 while being pressed by the first holding pad 42.

(3) The support portion 21 is a fixing portion that fixes the suction rod 31 to the support plate 20, and the support portion 22 is a movable support portion that supports the first holding rod 32 so as to be vertically movable with respect to the support plate 20. The movable support portion supports the first holding rod 32 via the spring 231 so that the downward biasing force of the first holding rod 32 increases as the protruding amount of the first holding rod 32 protruding downward from the support plate 20 decreases (FIG. 4A). As a result, with a simple configuration, the suction pad 41 can be raised while the protective film 202 is pressed by the first holding pad 42.

(4) The suction rods 31 and the first holding rods 32 are provided such that the first holding pads 42 are located between the suction pads 41 and the edge portions 202b of the protective film 202 when the support plate 20 is located at the first position (FIG. 3). As a result, the protective film 202 is pulled inward in the horizontal direction, and the protective film 202 can be easily peeled off from the workpiece 201.

(5) The film peeling apparatus 100 further includes a second holding rod 33 extending downward from the support plate 20 toward the tray 300 and having a second holding pad 43 at its lower end portion that contacts the upper surface of the protective film 202 when the support plate 20 is located at the first position (FIG. 5A). The second holding pad 43 includes an elastic body 431 so that the protective film 202 can be displaced while the protective film 202 is pressed by the second holding rod 33 (FIG. 5A). When the support plate 20 moves from the first position to the second position, the support portions 21 to 23 further support the second holding rod 33 so that the second holding rod 33 starts to rise before the first holding rod 32 starts to rise after the suction rod 31 starts to rise (FIGS. 5A to 5C and 7). As a result, vacuum breakdown can easily occur at the interface between the workpiece 201 and the protective film 202, and peeling of the protective film 202 can be promoted.

(6) The support portion 23 is a movable support portion that supports the second holding rod 33 so as to be vertically movable with respect to the support plate 20, and supports the second holding rod 33 via the spring 231 so that the downward biasing force of the second holding rod 33 increases as the protruding amount of the second holding rod 33 protruding downward from the support plate 20 decreases (FIG. 5A). The downward protrusion amount (length Z1) by which the biasing force of the first holding rod 32 becomes 0 is greater than the downward protrusion amount (length Z2) by which the biasing force of the second holding rod 33 becomes 0 (FIGS. 4A and 5A). As a result, with a simple configuration, the suction pads 41 can be raised while the protective film 202 is pressed by the second holding pad 43. Since the relationship between the lengths Z1 and Z2 is Z1>Z2, the first holding pad 42 is separated from the protective film 202 after the second holding pad 43 is separated from the protective film 202. That is, the protective film 202 is peeled off while the workpiece 201 is pressed by the first holding pads 42 in a state where air is infiltrated into the areas AR1 (FIG. 6) connecting the second holding pads 43 and the suction pads 41 to promote peeling of the protective film 202. This further promotes peeling of the protective film 202.

(7) The film peeling apparatus 100 includes a pair of suction rods 31 on both sides of the second holding rod 33 (FIG. 5A). The pair of suction rods 31 and the second holding rod 33 are provided such that when the support plate 20 is located at the first position, one of the pair of suction pads 41 and the second holding pad 43 are located adjacent to each other, and the second holding pad 43 is located between a virtual line L1 connecting the pair of suction pads 41 and an edge portion 22b of the protective film 202 (FIG. 3). As a result, air can infiltrate the areas AR1 on both sides of the second holding pad 43, which promotes peeling of the protective film 202.

(8) The protective film 202 has a substantially rectangular shape in plan view (FIG. 3). The pair of suction rods 31, the first holding rod 32, and the second holding rod 33 are provided such that when the support plate 20 is located at the first position, one of the pair of suction pads 41 and the second holding pad 43 are located side by side along the edge portion 202b of the protective film 202, the first holding pad 42 is located at a corner portion 202a of the protective film 202, and the other of the pair of suction pads 41 is located in line with the first holding pad 42 and on the opposite side of the corner portion 202a (FIG. 3). As a result, the first holding pad 42 and the second holding pad 43 can effectively interact with each other, and the entire protective film 202 can be easily peeled off.

(9) A film peeling method for peeling off a protective film 202 from a workpiece 201 to which the protective film 202 is tightly adhered includes: an initial moving step (first step) of disposing a support plate 20, which supports a suction rod 31 extending downward toward a tray 300 in which the workpiece 201 is placed and having a suction pad 41 at its lower end portion and a first holding rod 32 extending downward toward the tray 300 and having a first holding pad 42 at its lower end portion, above the tray 300; a lowering step (second step) of lowering the support plate 20 to a first position where the suction pad 41 and the first holding pad 42 contact the upper surface of the protective film 202; and a raising step (third step) of raising the support plate 20 while sucking the protective film 202 by the suction pad 41 (FIGS. 4A to 4D). The first holding pad 42 has a sliding portion 421 so that the protective film 202 can be moved in the horizontal direction while the protective film 202 is pressed by the first holding rod 32 (FIG. 4A). In the raising step, the first holding rod 32 is not raised until the suction rod 31 is raised by a predetermined amount (length Z1) (FIGS. 4A to 4D). As a result, the protective film 202 tightly adhered to the workpiece 201 can be easily peeled off from the workpiece surface.

(10) In the initial moving step, the support plate 20, which extends downward toward the tray 300 and further supports the second holding rod 33 having the second holding pad 43 at its lower end portion, is placed above the tray 300 (FIG. 5A). The second holding pad 43 includes an elastic body 431 so that the protective film 202 can be displaced while the protective film 202 is pressed by the second holding rod 33 (FIG. 5A). In the raising step, the second holding rod 33 is not raised until the suction rods 31 are raised by a predetermined amount (length Z2 smaller than the length Z1) (FIGS. 5A to 5C). The action of the second holding pad 43 promotes vacuum breakdown at the interface between the workpiece 201 and the protective film 202, which further promotes peeling of the protective film 202.

In the above embodiment, the support plate 20 (moving member) is raised and lowered above the tray 300 (placement member) using the articulated robot 10, but the moving member may be supported so as to be vertically movable using a device other than the robot. For example, the moving member may be supported so as to be vertically movable along a frame body erected in the vertical direction. In the above embodiment, the moving member is configured with the support plate 20, but the moving member may be other than the plate. The film peeling apparatus 100 includes the suction rod 31 (first rod) having the suction pad 41 (first contact portion) at its lower end portion, the first holding rod 32 (second rod) having the first holding pad 42 (second contact portion) at its lower end, and the second holding rod 33 (third rod) having the second holding pad 43 (third contact portion) at its lower end, but the third rod may be omitted.

In the above embodiment, a vacuum generator is connected to the suction pads 41 to suck the protective film 202, but the configuration of the suction portions is not limited to that described above. In the above-described embodiment, the sliding portion 421 of the first holding pad 42 is configured with a rotatable ball or roller, but the configuration of the sliding portion is not limited to the above-described configuration. A highly conductive roller or ionizer may be used in the sliding portion to obtain a function of removing static electricity. In the above-described embodiment, the support portion 22 supports the first holding rod 32 so as to be vertically movable with respect to the support plate 20 via the spring 221 (first spring), but the configuration of the movable support portion (first movable support portion) is not limited to the above-described configuration. In the above embodiment, the support portion 23 supports the second holding rod 33 so as to be vertically movable with respect to the support plate 20 via the spring 231 (second spring), but the configuration of the second movable support portion is not limited to the above-described configuration.

The above embodiment describes an example of peeling off the protective film 202 tightly adhered to the surface of the workpiece 201, using a resin frame constituting a membrane electrode assembly of a fuel cell as the workpiece 201, but the present invention can be similarly applied to peeling off a film from another workpiece to which the film is tightly adhered.

The above embodiment can be combined as desired with one or more of the above modifications. The modifications can also be combined with one another.

According to the present invention, the film tightly adhered to the workpiece can be easily peeled off with a simple configuration.

Above, while the present invention has been described with reference to the preferred embodiments thereof, it will be understood, by those skilled in the art, that various changes and modifications may be made thereto without departing from the scope of the appended claims.

What is claimed is:

1. A film peeling apparatus configured to peel a film from a workpiece to which the film is adhered, the film peeling apparatus comprising:
a moving member disposed above a placement member on which the workpiece is placed so as to be vertically movable between a first position and a second position above the first position;
a first rod extending downward from the moving member toward the placement member and having a first contact portion at a lower end portion of the first rod that contacts an upper surface of the film when the moving member is located at the first position;
a second rod extending downward from the moving member toward the placement member and having a second contact portion at a lower end portion of the second rod that contacts the upper surface of the film when the moving member is located at the first position; and
a support portion configured to support the first rod and the second rod from the moving member such that the first rod and the second rod move in a vertical direction with a movement of the moving member in the vertical direction, wherein
the first contact portion has a suction portion that sucks the film,
the second contact portion has a sliding portion so that the film can be moved in a horizontal direction while the film is pressed by the second rod, and
when the moving member moves from the first position to the second position, the support portion supports the first rod and the second rod so that the second rod starts to rise after the first rod starts to rise.

2. The film peeling apparatus according to claim 1, wherein
the sliding portion has a rotatable ball or roller.

3. The film peeling apparatus according to claim 1, wherein
the support portion has a fixing portion that fixes the first rod to the moving member, and a movable support portion that supports the second rod so as to be vertically movable with respect to the moving member, and
the movable support portion supports the second rod via a spring so that a downward biasing force of the second rod increases as a protruding amount of the second rod protruding downward from the moving member decreases.

4. The film peeling apparatus according to claim 1, wherein
the first rod and the second rod are provided such that the second contact portion is located between the first contact portion and an edge portion of the film when the moving member is located at the first position.

5. The film peeling apparatus according to claim 1, further comprising:
a third rod extending downward from the moving member toward the placement member and having a third contact portion at a lower end portion of the third rod that contacts the upper surface of the film when the moving member is located at the first position, wherein
the third contact portion includes an elastic body so that the film can be displaced while the film is pressed by the third rod, and
when the moving member moves from the first position to the second position, the support portion further supports the third rod so that the third rod starts to rise before the second rod starts to rise after the first rod starts to rise.

6. The film peeling apparatus according to claim 5, wherein
the support portion has a fixing portion that fixes the first rod to the moving member, a first movable support portion that supports the second rod so as to be vertically movable with respect to the moving member, and a second movable support portion that supports the third rod so as to be vertically movable with respect to the moving member,
the first movable support portion supports the second rod via a first spring so that a downward biasing force of the second rod increases as a protruding amount of the second rod protruding downward from the moving member decreases,
the second movable support portion supports the third rod via a second spring so that a downward biasing force of the third rod increases as a protruding amount of the third rod protruding downward from the moving member decreases, and a downward protrusion amount by which the downward biasing force of the second rod becomes 0 is greater than a downward protrusion amount by which the downward biasing force of the third rod becomes 0.

7. The film peeling apparatus according to claim 5, further comprising:
a pair of first rods on both sides of the third rod, wherein
the pair of first rods and the third rod are provided such that when the moving member is located at the first position, the first contact portion of one of the pair of first rods and the third contact portion of the third rod are located adjacent to each other, and the third contact portion of the third rod is located between a virtual line connecting first contact portions of the pair of first rods and an edge portion of the film.

8. The film peeling apparatus according to claim 7, further comprising:
the film having a substantially rectangular shape in plan view, wherein
the pair of first rods, the second rod, and the third rod are provided such that when the moving member is located at the first position, the first contact portion of a first one of the pair of first rods and the third contact portion of the third rod are located side by side along the edge portion of the film, the second contact portion of the second rod is located at a corner portion of the film, and the first contact portion of a second one of the pair of first rods located in line with the second contact portion and on an opposite side of the corner portion.

9. A film peeling method for peeling a film from a workpiece to which the film is adhered, the film peeling method comprising:
a first step of disposing a moving member, which supports a first rod extending downward toward a placement member in which the workpiece is placed and having a first contact portion at a lower end portion of the first rod and a second rod extending downward toward the placement member and having a second contact portion at a lower end portion of the second rod, above the placement member;
a second step of lowering the moving member to a first position where the first contact portion and the second contact portion contact an upper surface of the film; and
a third step of raising the moving member while sucking the film by the first contact portion, wherein
the second contact portion has a sliding portion so that the film can be moved in a horizontal direction while the film is pressed by the second rod, and
in the third step, the second rod is not raised until the first rod is raised by a predetermined amount.

10. The film peeling method according to claim 9, wherein
the disposing comprises disposing the moving member, which further supports a third rod extending downward toward the placement member and having a third contact portion at a lower end portion of the third rod, is placed above the placement member,
the lowering comprises lowering the moving member to the first position where the third contact portion contacts the upper surface of the film,
the predetermined amount is a first predetermined amount,
the third contact portion includes an elastic body so that the film can be displaced while the film is pressed by the third rod,
in the third step, the third rod is not raised until the first rod is raised by a second predetermined amount, and the second predetermined amount is smaller than the first predetermined amount.

11. A film peeling apparatus configured to peel a film from a workpiece to which the film is adhered, the film peeling apparatus comprising:
a support plate disposed above a tray on which the workpiece is placed so as to be vertically movable between a first position and a second position above the first position;
a first rod fixedly supported by the support plate and extending downward from the support plate toward the tray and having a suction pad at a lower end portion of the first rod that contacts an upper surface of the film when the support plate is located at the first position;
a second rod movably supported by the support plate and extending downward from the support plate toward the tray and having a first holding pad at a lower end portion of the second rod that contacts the upper surface of the film when the support plate is located at the first position, wherein
the first holding pad comprises a rotatable ball or roller so that the film is movable in a horizontal direction while the film is pressed by the second rod, and
when the support plate moves from the first position to the second position, the support plate supports the first rod and the second rod so that the second rod starts to rise after the first rod starts to rise.

12. The film peeling apparatus according to claim 11, wherein
the first rod is formed in a cylindrical shape and has an internal passage configured to connect the suction pad to a vacuum generator.

13. The film peeling apparatus according to claim 11, further comprising
a spring connected between an upper end portion of the second rod and an upper surface of the support plate.

14. The film peeling apparatus according to claim 11, further comprising:
a third rod movably supported by the support plate and extending downward from the support plate toward the tray and having a second holding pad at a lower end portion of the third rod that contacts the upper surface of the film when the support plate is located at the first position,
the second holding pad is an elastic body so that the film is displaceable while the film is pressed by the third rod, and
when the moving member moves from the first position to the second position, the support plate further supports the third rod so that the third rod starts to rise before the second rod starts to rise after the first rod starts to rise.

15. The film peeling apparatus according to claim 14, further comprising
a spring connected between an upper end portion of the third rod and an upper surface of the support plate.

16. The film peeling apparatus according to claim 14, further comprising
a first spring connected between an upper end portion of the second rod and an upper surface of the support plate,
a second spring connected between an upper end portion of the third rod and the upper surface of the support plate, and
when the support plate moves from the first position to the second position, the first holding pad is separated from the film after the second holding pad is separated from the film.

* * * * *